United States Patent [19]
Rao

[11] Patent Number: 5,657,281
[45] Date of Patent: Aug. 12, 1997

[54] SYSTEMS AND METHODS FOR IMPLEMENTING INTER-DEVICE CELL REPLACEMENTS

[75] Inventor: G. R. Mohan Rao, Dallas, Tex.

[73] Assignee: Cirrus Logic, Inc., Fremont, Calif.

[21] Appl. No.: 613,316

[22] Filed: Mar. 11, 1996

[51] Int. Cl.[6] .................................................. G11C 7/00
[52] U.S. Cl. ................. 365/200; 365/225.7; 365/230.03
[58] Field of Search ............................. 365/200, 225.7, 365/230.03

[56] References Cited

U.S. PATENT DOCUMENTS

| | | | |
|---|---|---|---|
| 5,265,054 | 11/1993 | McClure | 365/200 |
| 5,381,370 | 1/1995 | Lacey et al. | 365/200 |
| 5,485,424 | 1/1996 | Kawamura | 365/200 |
| 5,523,974 | 6/1996 | Hirano et al. | 365/200 |

*Primary Examiner*—Son T. Dinh
*Attorney, Agent, or Firm*—Winstead Sechrest & Minick, P.C.

[57] ABSTRACT

A memory system 200 including a first memory unit 201 having an array of memory cells and a second memory unit 201 having an array of memory cells including a number of redundant cells. A crossbar switch 202 is provided for switching an address to a defective cell in the array of the first memory unit 201 to the second memory unit 202 to access a selected one of the redundant cells.

25 Claims, 2 Drawing Sheets

SYSTEMS AND METHODS FOR IMPLEMENTING INTER-DEVICE CELL REPLACEMENTS

TECHNICAL FIELD OF THE INVENTION

The present invention relates in general to electronic memories and in particular to systems and methods for implementing inter-device cell replacements.

BACKGROUND OF THE INVENTION

The most significant use of electronic memory chips, and in particular dynamic random access memory (DRAM) chips, is in the construction personal computers. In such applications, each memory device is expected to be fully functional; even only partially defective memory chips are normally not used. Thus, various techniques have been developed to increase memory chip manufacturing yields, especially in state of the art chips which have not reached "yield maturity" (yield maturity is normally achieved only as the manufacturing process is refined over time).

One technique for improving yield is replacement of defective cells identified during wafer testing with "spare" or "redundant" cells included in each memory cell array. In particular, the use of on-chip redundant rows and columns of cells for replacing defective rows and columns in a dynamic random access memory (DRAM) cell array is well established in the art. The basics of defective cell replacement are set forth, for example, in Fitzgerald and Thomas, *Circuit Implementation of Fusible Redundant Addresses on RAMs for Productivity Enhancement*, IBM Journal of Research and Development, Vol. 24, No. 3, May 1980.

Generally, in currently available DRAMs, the wordlines of the primary rows and the input/output devices of the sense amplifiers of the primary columns of each array or bank are connected to the corresponding row and column address decoders by programmable links, typically laser programmable fuses or electrically-programmable read-only memory (EPROM) cells. During probe testing, defective rows and/or columns are identified and then functionally removed from the remainder of the array by programming the appropriate links as required to disconnect each defective row or column from the associated address decoder.

In a typical DRAM, the array(s) of each chip is fabricated with a given number of spare rows and spare columns (along with corresponding spare sense amplifiers). Typically, 5% of the rows and columns for a given array are redundant cells, at the most. Each spare row and column is associated with a programable address decoder/driver. When a defective row or column is functionally removed from the array, the address decoder circuitry for a selected spare row/column in the array is programmed (again using programmable links) to respond to the same address to which the address decoder circuitry of the defective row/column was to respond. As a result, addresses to the defective row/column are redirected (steered) to a good redundant row/column and accesses made without error.

Current repair techniques however do not allow for the replacement of a defective row or column in one array or device with a good redundant column of another array or device without the payment of significant cost and performance penalties. Typically, the cells of each DRAM device are addressable by a fixed set of row/column address bits. In a multiple device memory bank, the row/column address set (space) is typically the same for all devices within each bank to minimize circuitry overhead. For example, assume that a bank of four 256k×16 DRAMs is supporting a 64-bit data bus. Then to access a 64-bit word, each device receives the same eight address bits A0–A7 simultaneously. Thus, for example, if Row 0 at Address 0 in Device A is defective and Row 0 at Address 0 in Bank B is operational, then Row 0 of Device A cannot simply be replaced by disconnecting it from the associated row decoder and programing a redundant row in Bank B to respond to Address 0, since Address 0 already maps to an operational row in Device B.

The inability to efficiently perform device to device replacements of defective rows and columns results in the inability to optimize device yields and thus eventually reduce system cost. For instance, after wafer testing, one device may have more defective rows (or columns) than redundant rows (or columns) available for repair while another device on the same bank may have an excess of redundant rows (or columns). Currently, the device with excess defective cells must be discarded since there is no available known technique for matching it with the device with excess redundant cells and performing inter-device cell replacement, at reasonable cost (of course, one can have redundant devices).

Thus, the need has arisen for memory devices and associated system architectures which allow for replacement of a defective row or column of a given memory device with an operational row or column of another memory device. This feature would allow for memory devices which normally would be discarded to be salvaged with the aid of a similar device having an excess of operational spare cells. Such a scheme will reduce system costs, with very little performance penalty (memory latency, power dissipation, minimal system overhead, etc.)

SUMMARY OF THE INVENTION

According to a first embodiment of the principles of the present invention, a memory system is provided which includes a first memory unit having an array of memory cells and a second memory unit having an array of memory cells including a number of redundant cells. A crossbar switch is provided which is operable to switch an address to a defective cell in the array of the first memory unit to the second memory unit to access selected one of the redundant cells therein.

According to a second embodiment of the principles of the present invention, a memory is provided which includes a first array of memory cells accessible by a set of addresses. A second array of memory cells is provided which includes a first number of cells addressable by a first set of addresses and a second number of cells addressable by a second set of addresses. The memory also includes a programmable crossbar switch operable to convert a received address to defective ones of the cells in the first array to a selected one of the second set of addresses and switch the selected one of the second set of addresses to access the second array.

According to a third embodiment of the principles of the present invention, a memory system is provided which includes a plurality of memory units each having an array of rows and columns of primary memory cells addressable by a first set of addresses and a selected number of rows and columns of redundant memory cells addressable by a second set of addresses. A programmable crossbar switch is provided for receiving a first address in the first set of addresses and addressing a defective cell in the array of a first one of the units and converting the first address to a second address in the second set of addresses and switching the second address to a second one of the memory units to access selected cells therein.

The principles of the present invention are also embodied in methods for performing memory cell replacements. According to one such method, an address to a defective group of cells in a first memory cell array is identified. An available group of redundant cells in a second memory cell array are identified, the available redundant cells having an address. The address to the defective group of cells in the first array is converted upon receipt to the address of the available redundant cells. The address to the available redundant cells are then switched through a crossbar switch to access the available redundant cells.

Circuits, systems and methods embodying the principles of the present invention provide substantial advantages over the prior art. Among other things, these principles allow for the replacement of a defective row or column of a given memory device with an operational row or column of another memory device. This feature advantageously allows for memory devices which normally would be discarded during manufacturing to be salvaged with the aid of similar devices having an excess of operational spare cells.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
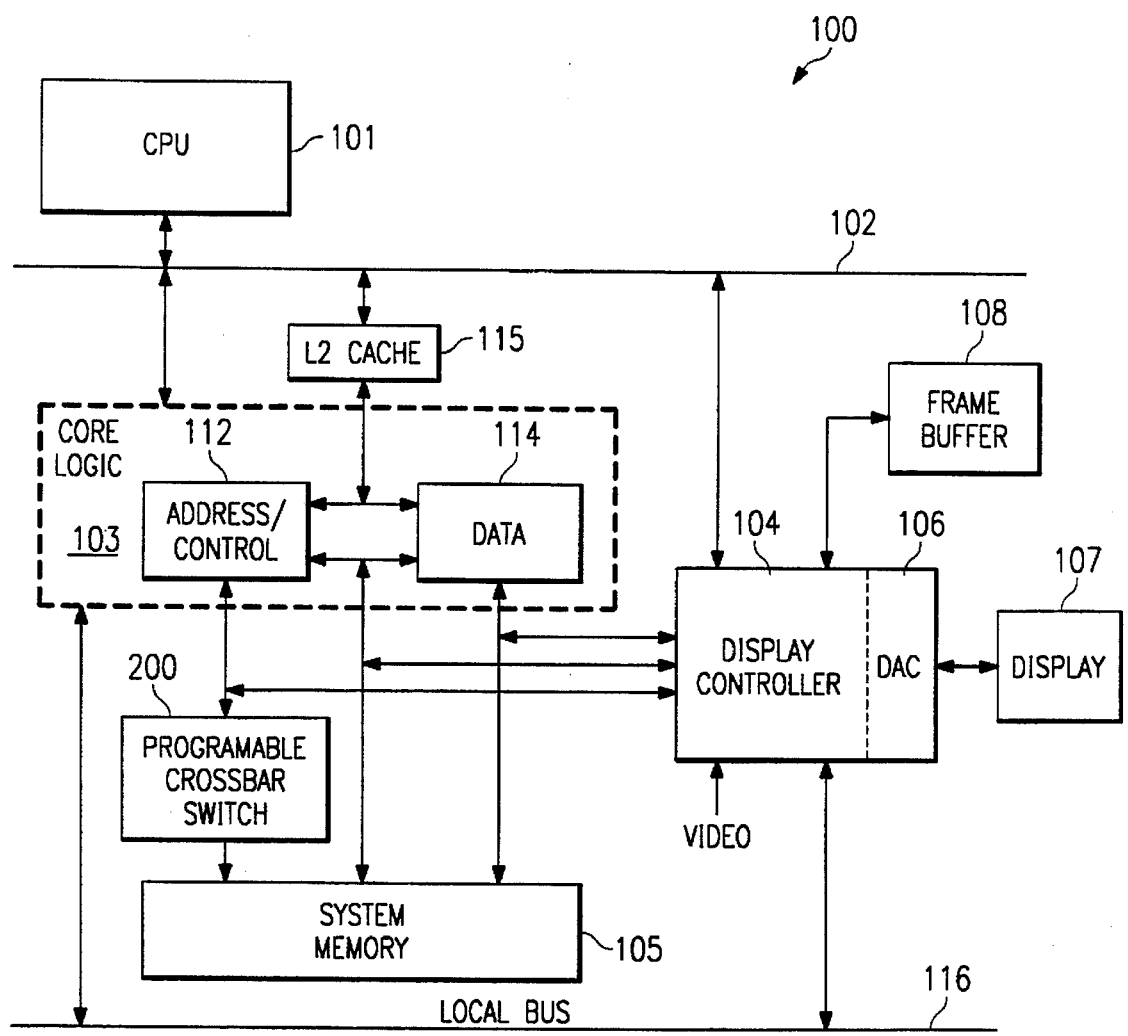
FIG. 1 is a functional block diagram of a data processing system architecture embodying the principles of the present invention.
Figure 2:
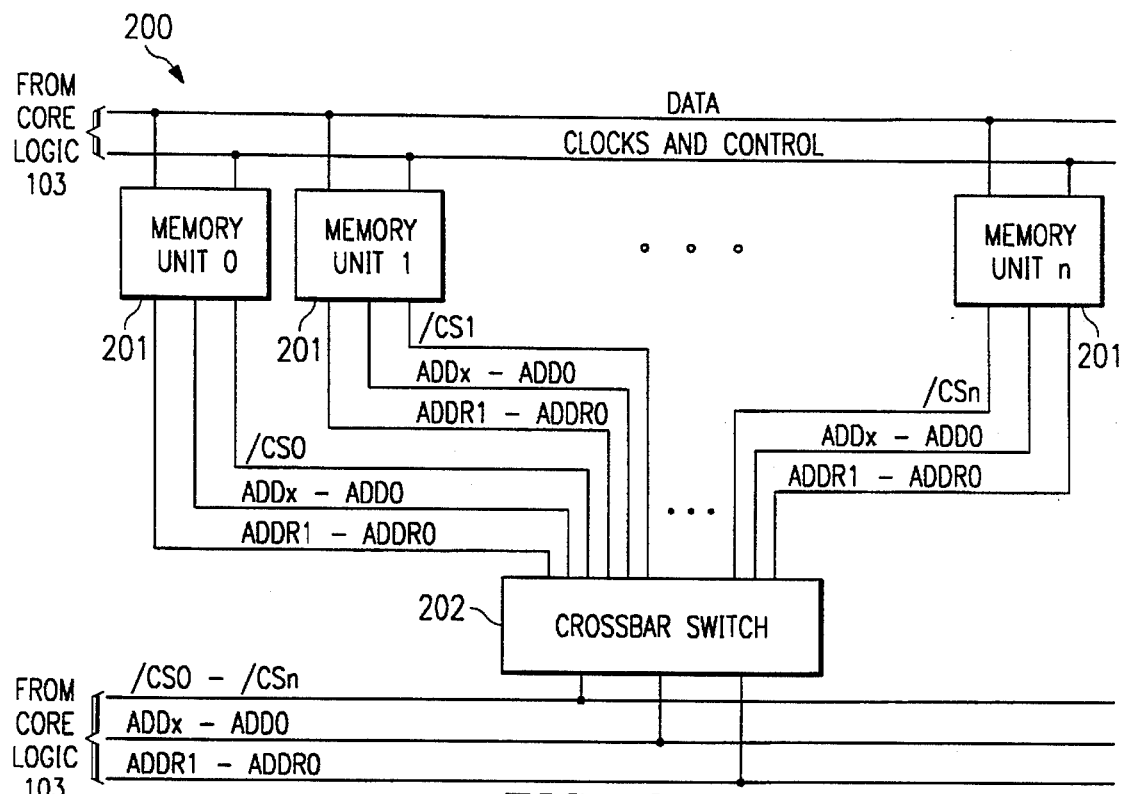
FIG. 2 is a more detailed functional block diagram of a memory subsystem according to the principles of the present invention.
Figure 3:
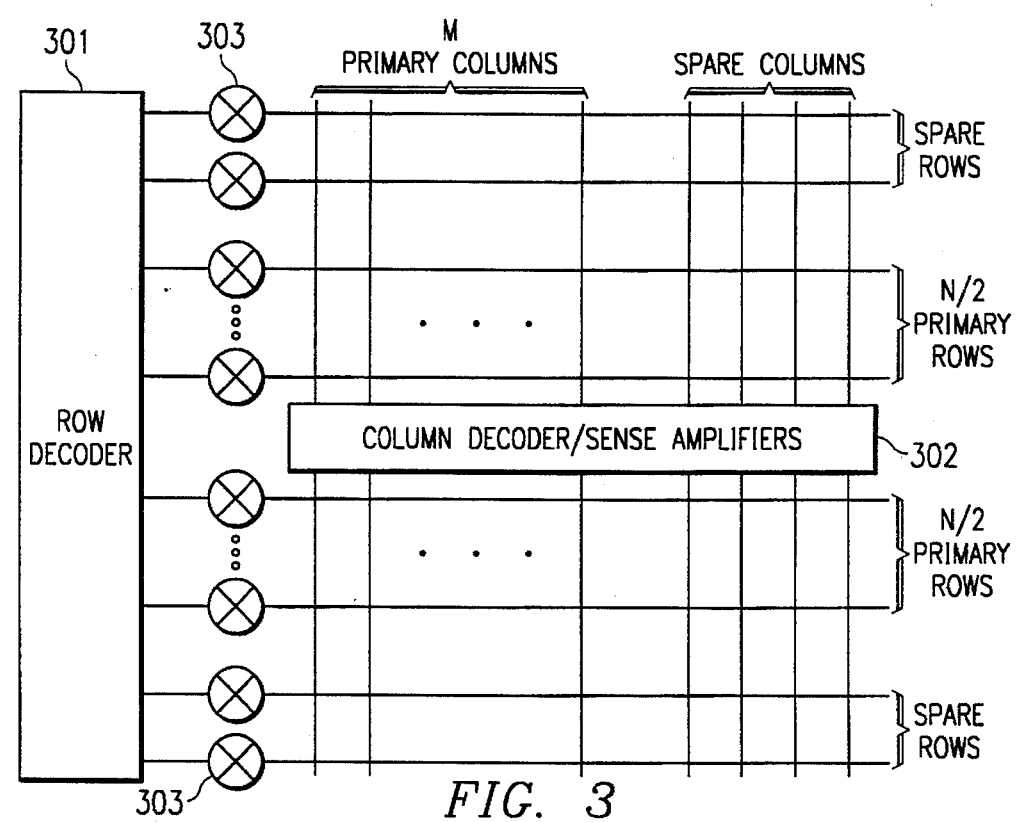
FIG. 3 is a functional block diagram of a typical memory cell array including a selected number of rows and columns of memory cells.

The principles of the present invention and their advantages are best understood by referring to the illustrated embodiment depicted in FIGS. 1-3 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

FIG. 1 is a high level functional block diagram of the portion of a processing system 100. System 100 includes a central processing unit 101, a CPU local bus 102, core logic 103, a display controller 104, a system memory 105, a digital to analog converter (DAC) 106, frame buffer 108 and a display device 107.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium™ class microprocessor or the like, used in commercial personal computers. CPU 101 communicates with the remainder of system 100 via CPU local bus 102, which may be for example a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address intensive" while one or more core logic chips, such as chip 114 in FIG. 1, are "data intensive." CPU 101 can directly communicate with core logic 103 or through an external (L2) cache 115. L2 cache 115 may be for example a 256 KByte fast SRAM device(s). It should be noted that CPU 101 can also include on-board (L1) cache. In alternate embodiments, core logic 103 may include, or be replaced by, a memory controller.

Display controller 104 may be any one of a number of commercially available VGA display controllers. Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus which may be for example a PCI local bus. Generally, display controller 104 controls screen refresh, executes a limited number of graphics functions such as line draws, polygon fills, color space conversion, display data interpolation and zooming, and video streaming and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive display 107 in response. In the illustrated embodiment, DAC 106 is integrated with display controller 104 onto a single chip. Depending on the specific implementation of system 100, DAC 106 may also include a color palette, YUV to RGB format conversion circuitry, and/or X- and Y- zooming circuitry, to name a few options. Display 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. It should be noted that the address interconnections will vary depending on the size of the memory and such factors as the need to support data byte select and virtual memory operations. In a Pentium processor system, the address portions of CPU bus 102 and PCI bus 116 are typically on the order of 30 bits wide.

According to the principles of the present invention, a programmable crossbar switch is disposed in the data path between core logic 103 and system memory 105. A programmable crossbar switch 200 may also be provided in the address path between display controller 104 and frame buffer 108. Programmable crossbar switch 200 will be described in detail below in conjunction with FIG. 2.

FIG. 2 is a more detailed functional block diagram of a memory subsystem 200 embodying the principles of the present invention. In addition to the illustrated application in system 100, memory subsystem 200 may be used in a number of other memory applications known in the art.

Memory subsystem 200 includes a plurality of n number of memory units 201. Memory units 200 may be for example discrete memory devices such as dynamic random access memories (DRAMs), static random access memories (SRAMs), electrically programmable read-only memories (EPROMs) or electrically-programmable electrically-erasable read-only memories (EEPROMs). Each memory unit 200 may also be a multiple-chip device such as a multiple DRAM chips packaged as a single in-line memory module (SIMM). In general, memory unit 200 may be any type of memory device which includes rows and/or columns of redundant memory cells in the cell array for use in replacing defective rows/columns of memory cells.

A typical DRAM array 300 is shown in FIG. 3 for illustrative purposes. In this example, the array includes N number of primary rows and four (4) spare rows of memory cells. The wordline of each row is coupled to an associated row decoder 301 through a programmable link 303, such as a laser programmable fuse or PROM cells. The number of spare rows in the upper subarray is preferably equal to the number of spare rows in the lower subarray for load balance. The depicted array includes M number of primary columns and four (4) spare columns of memory cells. The columns of memory array 300 are coupled to an associated column decoder in an open-bitline fashion. The columns may be disabled by appropriately programming programmable links similar to links 303 within column decoder/sense amplifier circuitry 302. Preferably, these programmable links disconnect the decoder/driver for the column being disabled from the amplifiers/buffers of the global input/output circuitry of column decoder/sense amplifier circuitry 302. As is convention, a "column" herein references one physical column of cells for a "by 1" device, 16 physical columns of cells for a "by 16" device and so on.

For discussion purposes, assume that each memory unit 201 includes an array similar to that shown in FIG. 3, with 2048 primary rows (n=2048), 2048 1-bit wide primary columns (m=208), 4 spare (redundant) rows and 4 spare (redundant) columns. In this case, 11 row address bits and 11 column address bits are required to access one cell (location) in the array (i.e. the memory is a by 1 device). Assuming multiplexed addressing, each memory unit 201 will receive the 11 row address bits ADD0–ADD10 timed by a row address strobe/RAS and subsequently receive column address bits ADD0–ADD10 timed by a column address strobe/CAS. The principles of the present invention apply equally well to non-multiplexed address schemes where all row and column address bits are presented to units 201 simultaneously. In this case, and for the same size and configuration memory, 22 address bits and 4 redundancy address bits are presented to memory unit 201 along with the appropriate chip select and control signals.

According to the principles of the present invention, each primary row address is received along with a number of redundancy address bits. In the present example where 4 redundant rows are provided, two redundancy row address bits ADDR0–ADDR1 are required. Similarly, each primary column address is received along with a given number of column address bits, where 4 spare columns are provided in the array, two redundancy address bits ADDR0–ADDR1 are required. In the preferred embodiment, the redundancy address bits are the least significant bits of each row address or column address word. For illustration purposes, address words will be designated as ADDX–ADD0, ADDR1–ADDR0. Thus, the first address to a primary row is at decimal address 05 or binary address 00000000001 00.

In exemplary system 100, each memory unit 201 receives data and clocks and control signals from core logic 103 or in more sophisticated system, from a memory controller. The clocks and control signals include /RAS, /CAS, output enable /OE, write enable /WE and in the case of synchronous DRAMs, a master clock CLK and clock enable signal CKE. Chip select to a memory unit n is implemented with a chip select signal /CSn.

According to the principles of the present invention, the primary address bits ADDX–ADD0, the redundancy address bits ADDR1–ADDR0, and the chip select signals /CS0–/CSn are routed to the memory units 201 through a programmable crossbar switch 202. Programmable crossbar switch may be constructed for example from a programmable device such as a field programmable gate array, field programmable logic array, glue logic, RAMs, EPROMs, or polysilicon fuses, to name a few options, together with a high-speed crossbar switch. Such high speed crossbar switches are disclosed in "Advanced CMOS Logic Data Book", 1993 edition, Texas Instruments Incorporated, Dallas, Tex. The programmable device allows an address to a defective row/column to be modified to an address within the address set defined by address bits ADDR1–ADDR0. The high-speed crossbar switch 202 in general allows any port to interconnect with any other port in one pass through the interconnection. Thus, programmable crossbar 202 allows an address to a location in a defective row or column in one memory unit 201 to be converted to a redundancy address ADDR1–ADDR0 and the new redundancy address steered to another selected memory unit 201 which includes an unused redundant row or column at that redundancy address. With appropriate design choices, the programmable crossbar may only add a propagation delay of 5 or 6 nanoseconds.

The operation of crossbar 202 according to the principles of the present invention can best be described with the following example. It should be recognized that while this example considers row repair (replacement), column repair is substantially similar.

Assume that during wafer testing 5 defective rows are identified in Memory Unit 0. The five defective rows are disabled by disconnection from the associated row decoder 301 using the corresponding programmable links 303. Four of the defective rows are repaired by conventional techniques using the four redundant rows available in the Unit 0 array. This leaves one row in Unit 0 which cannot be repaired through conventional on-chip replacement.

According to the principles of the present invention, an available redundant row is identified on a second memory Unit, for example Memory Unit 1. This is done after Unit 1 has undergone conventional row replacement for any defective rows identified in the Unit 1 array. In other words, even after conventional on-chip row replacement has occurred, at least one redundant row is still available in Unit 1 to be shared with Unit 0.

According to a further aspect of the present invention, a given memory unit 201 may be provided with a "redundancy status" pin. This pin can aid in the identification of available redundant cells. If the pin is high, at least one spare element (row or column) is available and if the pin is low, no spare elements are available. A redundancy status pin can be implemented by connecting a bond pad to Vcc through a fuse or other programmable element. During wafer testing, the fuse is blown if no spare elements are available.

Returning to the present example, crossbar 202 is programmed, preferably in hardware although alternatively the programming could be in software, to output an address to a location at a fully operational row and column in Unit 1 in response to the receipt of an address to a location along the remaining defective row in Unit 0. The active chip select signal/CS is also re-routed by crossbar switch 202 from memory Unit 0 to memory Unit 1. It should be noted that for either multiplexed or non-multiplexed address systems, crossbar 202 responds to the entire address including both the row and column addresses during the process of re-routing. In the preferred embodiment, if the an address to a defective row is being re-routed, the column address bits remain the same and are simply switched to the new Unit 1 along with the new (redundancy) row address, and vice versa. Assume for discussion purposes that the row address output from the associated memory controller or core logic is to a location in a defective primary row at row address 00000000001 00 and an operational column at column address 00000000001 00. Also assume that a redundant row is available in Unit 1 at row address 00000000000 01. Then, programmable crossbar 202 in response outputs a row address 00000000000 01 and a column address 00000000001 00 to Unit 1. The active chip select signal which was directed to Unit 0 as signal /CS0 is switched to Unit 1 as signal /CS1.

With the steering of the address to a defective row in Unit 0 to Unit 1, some provision must be made to insure that Unit 1 is in the active state and ready to be accessed. In the preferred embodiment, the control signals such as /RAS and /CAS are redirected from Unit 0 to Unit 1 by the memory controller or core logic. For example, if Units 201 are operated in an interleaved or alternating bank fashion, Unit 1 may be in precharge with /RAS in a logic high state when Unit 0 is being addressed and accessed. With the steering of an access from Unit 0 to Unit 1, the memory controller or core logic provides the requisite control signal to insure that Unit 1 is active and prepared for accessing when the steered address arrives. In alternate embodiments, clocks and control signals may be switched through the crossbar switch.

Defective column replacement is substantially similar. In this case, the column address is modified to become a redundancy address ARx–AR0 and switched to the memory unit 201 containing the replacement column. It should also be recognized that in some cases an addressed location may be along both a defective row and a defective column; in this case, both the row and column addresses will be appropriately modified and steered to a location along an operational row and operational column.

Although the present invention and its advantages have been described in detail, it should be understood that various changes, substitutions and alterations can be made herein without departing from the spirit and scope of the invention as defined by the appended claims.

What is claimed is:

1. A memory system comprising:
   a first memory unit having an array of memory cells;
   a second memory unit having an array of memory cells including a number of redundant cells;
   an address bus; and
   a crossbar switch operable to switch an address addressing a defective cell in said array of said first memory unit and presented on said address bus to said second memory unit to access a selected one of said redundant cells.

2. The memory system of claim 1 wherein said crossbar switch is further operable to modify said address to generate a new address for switching to said second memory unit to accessing said selected one of said memory cells.

3. The memory system of claim 1 wherein said arrays comprise arrays of random access memory cells.

4. The memory system of claim 1 wherein said arrays comprise arrays of read-only memory cells.

5. The memory system of claim 1 wherein said memory units comprise dynamic random access memories packaged as single in line memory modules.

6. The memory system of claim 1 wherein said crossbar switch is further operable to switch a chip select signal from said first memory unit to said second memory unit.

7. A memory comprising:
   a first array of memory cells accessible by a set of addresses;
   a second array of memory cells including a first number of cells addressable by a first set of addresses and a second number of cells addressable by a second set of addresses;
   an address bus for carrying addresses; and
   a programmable crossbar switch operable to convert an address received from said address bus and addressing defective ones of said cells in said first array to a selected one of said second set of addresses and switch said selected one of said second set of addresses to access said second array.

8. The memory system of claim 7 wherein said second number of cells in said second array comprise redundant cells.

9. The memory system of claim 8 wherein said second number of cells in said second array comprise redundant rows of memory cells.

10. The memory system of claim 8 wherein said second number of cells in said second array comprise redundant columns of memory cells.

11. The memory system of claim 7 wherein said crossbar is further operable to switch a chip select signal from said first memory to said second memory.

12. The memory system of claim 7 wherein said first and second arrays are fabricated on separate integrated circuit chips.

13. The memory system of claim 12 wherein said separate chips are disposed in separate packages.

14. The memory system of claim 7 wherein said set of addresses for addressing said first array is the same as said first set of addresses addressing said first number of cells in said second array.

15. A memory system comprising:

a plurality of memory units each including an array of rows and columns of primary memory cells addressable by a first set of addresses and a selected number of rows and columns of redundant memory cells addressable by a second set of addresses;

an address bus; and a programable crossbar switch for coupling addresses from said address bus to a selected one of said memory units, said crossbar switch receiving a first address in said first set of addresses and addressing a defective cell in said array of a first one of said units and converting said address to a second address in said second set of addresses and switching said second address to a second one of said memory units.

16. The memory system of claim 15 wherein said programmable crossbar switch is further operable to present an active chip select signal to said second one of said memory units to select said second memory unit for accessing.

17. The memory system of claim 15 and further comprising memory control circuitry for providing timing and control signals for operating said second memory unit in an active cycle.

18. The memory system of claim 17 wherein said memory control circuitry comprises core logic.

19. The memory system of claim 17 wherein said memory control circuitry comprises a memory controller.

20. The memory system of claim 17 wherein said memory units comprise discrete dynamic random access memory devices.

21. The memory system of claim 17 wherein said memory units dynamic random access memory single in line memory modules.

22. A method of performing memory cell replacements comprising the steps of:

identifying an address to a defective group of cells in a first memory cell array;

identifying an available group of redundant cells in a second memory cell array, the available redundant cells having an address;

converting the address to the defective group of cells in the first array to the address of the available redundant cells in the second array;

presenting the address of the available redundant cells on an address bus; and switching the address to the available redundant cells presented on the address bus through a crossbar switch to access the available redundant cells.

23. The method of claim 22 and further comprising the step of replacing at least one other defective group of cells within the first array with operational cells within the first array.

24. The method of claim 22 and further comprising the step of replacing a defective group of cells within the second memory cell array with operational cells within the first cell array.

25. The method of claim 22 wherein said step of converting includes the substep of modifying at least one least significant bit of the received address.

* * * * *